US006990205B1

(12) United States Patent
Chen

(10) Patent No.: US 6,990,205 B1
(45) **Date of Patent: *Jan. 24, 2006**

(54) APPARATUS AND METHOD FOR PRODUCING VIRTUAL ACOUSTIC SOUND

(75) Inventor: Jiashu Chen, Holmdel, NJ (US)

(73) Assignee: Agere Systems, Inc., Allentown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/082,264

(22) Filed: May 20, 1998

(51) Int. Cl.
*H04R 5/00* (2006.01)
*H03G 3/00* (2006.01)

(52) U.S. Cl. ............................ 381/17; 381/61; 381/63

(58) Field of Classification Search .................. 381/17, 381/63
See application file for complete search history.

(56) References Cited

U.S. PATENT DOCUMENTS 4,731,848 A * 3/1988 Kendall et al. ............... 381/63
5,438,623 A * 8/1995 Begault ....................... 381/17
5,467,401 A * 11/1995 Nagamitsu et al. ........... 381/63
5,500,900 A 3/1996 Chen et al. .................... 381/17
5,596,644 A 1/1997 Abel et al. ..................... 381/17
5,764,777 A * 6/1998 Goldfarb ..................... 381/27
5,802,180 A 9/1998 Abel et al. ..................... 381/17
5,822,438 A * 10/1998 Sekine et al. ................. 381/17
5,995,631 A * 11/1999 Kamada et al. ................ 381/1
6,038,330 A * 3/2000 Meucci, Jr. ................. 381/371
6,118,875 A * 9/2000 M.o slashed.ller et al. ..... 381/1

OTHER PUBLICATIONS

Foster, Scott H.; Wenzel, Elizabeth M.; Taylor, R. Michael; "*Real Time Synthesis of Complex Acoustic Environments*"; Proceedings of the ASSP (IEEE)Workshop on Applications of Signal Processing to Audio and Acoustics, 1991.

Wenzel, Elizabeth M.; Foster, Scott H.; Wightman et al.; "*Realtime Digital Synthesis of Localized Auditory Cues Over Headphones*", Proceedings of the ASSP (IEEE) Workshop on Application of Signal Processing to Audio and Acoustics, 1989.

Anderson, David B. and Casey, Michael A.; "*The Sound Dimension*", IEEE Spectrum, pp. 46-51, Mar. 1997.

Wright, Maury; "*3-D Audio: Above and Behind You or Moving Low Left to Right?*"; EDN, pp. 87-99, Jun. 6, 1996.

Kendall, Gary S.; "*A 3-D Sound Primer: Directional Hearing and Stereo Reproduction*"; Computer Music Journal, 19:4, pp. 23-46, Winder 1995.

* cited by examiner

*Primary Examiner*—Laura A. Grier

(57) ABSTRACT

A head-related impulse response to describe sound signals in a spatial environment is shown to accurately approximate three-dimensional sound data using limited computations, and can also be transformed for ease of computation. The head-related impulse response and disclosed computational methods thereof can be used to produce three-dimensional sound via a method described and refined. Implementations of the method can be used for applications with one or more sound sources, which may or may not have reflective information, and reproduced for a single listener or for multiple listeners.

13 Claims, 11 Drawing Sheets

APPARATUS AND METHOD FOR PRODUCING VIRTUAL ACOUSTIC SOUND

BACKGROUND OF THE INVENTION

1. Field of the Invention

The present invention relates to an apparatus and method of producing three-dimensional (3-D))sound, and, more specifically, to producing a virtual acoustic environment (VAE) in which multiple independent 3D sound sources and their multiple reflections are synthesized by acoustical transducers such that the listener's perceived virtual sound field approximates the real world experience. The apparatus and method have particular utility in connection with computer gaming, 3D audio, stereo sound enhancement, reproduction of multiple channel sound, virtual cinema sound, and other applications where spatial auditory display of 3D space is desired.

2. Description of Related Information

The ability to localize sounds in three-dimensional space is important to humans in terms of awareness of the environment and social contact with each other. This ability is vital to animals, both as predator and as prey. For humans and most other mammals, three-dimensional hearing ability is based on the fact that they have two ears. Sound emitted from a source which is located away from the median plane between the two ears arrives at each ear at different times and at different intensities. These differences are known as interaural time difference (ITD) and interaural intensity difference (IID). It has long been recognized that the ITD and IID are the primary cues for sound localization. ITD is primarily responsible for providing localization cues for low frequency sound (below 1.0 kHz), as the ITD creates a distinguishable phase difference between the ears at low frequencies. On the other hand, because of head shadowing effects, IID is primarily responsible for providing localization cues for high frequency (above 2.0 kHz) sounds.

In addition to interaural time difference (ITD) and interaural intensity difference (IID), head-related transfer functions (HRTFs) are essential to sound localization and sound source positioning in 3D space. HRTFs describe the modification of sound waves by a listener's external ear, known as the pinnae, head, and torso. In other words, incoming sound is "transformed" by an acoustic filter which consists of pinna, head, and torso. The manner and degree of the modification is dependent upon the incident angle of the sound source in a sort of systematic fashion. The frequency characteristics of HRTFs are typically represented by resenance peaks and notches. Systematic changes of the notches and peaks of the positions in the frequency domain with respect to elevation change are believed to provide localization cues.

ITD and IID have long been employed to enhance the spatial aspects of stereo system effects, however the sound images created are perceived as within the head and in between the two ears when a headphone set is used. Although the sound source can be lateralized, the lack of filtering by HRTF causes the perceived sound image to be "internalized," that is, the sound is perceived without a distance cue. This phenomenon can be experienced by listening to a CD using a headphone set rather than a speaker array. Using HRTFs to filter the audio stream can create a more realistic spatial image; this results in images with sharper elevation and distance perception. This allows sound images to be heard through headphone set as if the images are from a distance away with an apparent direction, even the image is on the median plan where the ITD and IID diminish. Similar results can be obtained with a pair of loudspeakers when cross-talk between the ears and two speakers is resolved.

Commercial 3-D audio systems known in the art are using all the three localization cues, including HRTF filtering, to render 3-D sound images. These systems demand a computing load uniformly proportional to the number of sources simulated. To reproduce multiple, independent sound sources, or to faithfully account for reflected sound, a separate HRTF must be computed for each source and each early reflection. The total number of such sources and reflections can be large, making the computation costs prohibitive to a single DSP solution. To address this problem, systems known in the art either limit the number of sources positioned or use multiple DSPs in parallel to handle multi-source and reflected audio reproduction with a proportionally increased system cost.

The known art has pursued methods of optimizing HRTF processing. For example, the principal component analysis (PCA) method uses principal components modeled upon the logarithmic amplitute of HRTFs. Research has shown that five principal components, or channels of sound, enable most people to localize the sound waves as well as in a free field. However, the non-linear nature of this approach limits it to a new way of analyzing HRTF data (amplitude only), but does not enable faster processing of HRTF filtering for producing 3D audio.

A need exists for a simple and economical method that can reliably reproduce 3-D sound without using an exponential array of DSPs. Another optimization method, the spatial feature extraction and regularization (SFER) model, constructs a model HRTF data covariance matrix and applys eigen decomposition to the data covariance matrix to obtain a set of M most significant eigen vectors. According to the Karhunen-Loeve Expansion (KLE) theory each of the HRTFs can be expressed as weighted sum of these eigen vectors. This enables the SFER model to establish linearity in the HRTF model, allowing the HRTF processing efficiency issue to be addressed. The SFER model has also been used in the time domain. That is, instead of working on HRTFs which are defined in frequency domain as transfer functions, the later work applied KLE to head-related impulse responses (HRS). HRIRs represent time domain counterpart of HRTFs. Though, in principal, the later approach is equivalent to the frequency domain SFER model, working with HRIRs has the additional advantage of avoiding complex calculations, which is a very favorable change in DSP code implementation.

SUMMARY OF THE INVENTION

The method and apparatus of the present invention overcome the above-mentioned disadvantages and drawbacks which are characteristic of the prior art. The present invention provides a method and apparatus to use two speakers and readily-available, economical multi-media DSPs to create 3-D sound. The present invention can be implemented using a distributed computing architecture. Several microprocessors can easily divide the computational load. The present invention is also suitable to scaleable processing.

The present invention provides a method for reducing the amount of computations required to create a sound signal representing one or more sounds, including reflections of the primary source of each sound, where the signal is to be perceived by a listener as emanating from one or more selected positions in space with respect to the listener. The method discloses a novel, efficient solution for synthesizing a virtual acoustic environment (VAE) to listeners, where multiple sound sources and their early reflections can be dynamically or statically positioned in three dimensional space with not only temporal high fidelity but also a correct spatial impression. It addresses the issues of recording and playback of sound and sound recordings, in which echo-free sound can be heard as if it is in a typical acoustic environment, such as a room, a hall, or a chamber, with strong directional cues and localizability in these simulated environments. The method and apparatus of the present invention implement sound localization cues including distance introduced attenuation (DIA), distance introduced delay (DID), interaural time difference (ITD), interaural intensity difference (IID), and head-related impulse response (HRIR) filtering.

The present invention represents HRIRs discretely sampled in space as a continuous function of spatial coordinates of azimuth and elevation. Instead of representing HRIR using measured discrete samples at many directions, the present invention employs a linear combination of a set of eigen filters (EFs) and a set of spatial characteristic functions (SCFs). The EFs are functions of frequency or discrete time samples only. Once they are derived from a set of measured HRIRs, the EFs become a set of constant filters. On the other hand, the SCFs are functions of azimuth and elevation angles. To find the HRIR at a specific direction, a set of SCF samples are first obtained by evaluating the SCFs at specific azimuth and elevation angles. Then SCF samples are used to weigh the EFs and the weighted sum is the resultant HRIR. This representation approximates the measured HRIRs optimally in a least mean square error sense.

To synthesize a 3D audio signal from a specific spatial direction for a listener, a monaural source is first weighted by M samples of SCFs evaluated at the intended location to produce M individually weighted audio streams, where $2 \leqq M \leqq N$ and N is the length of HRIRs. Then, the M audio streams are convoluted with M EFs to form M outputs. The summation of the M outputs thus represent the HRIR filtered signal as a monaural output to one ear. Repeating this same process, a second monaural output can be obtained. These two outputs can be used as a pair of binaural signals as long as all the binaural difference (ITD, IID, and two weight sets for left and right HRIRs) are incorporated. The two sets of weights will differ unless the sound source is right in the median plane of the listener's head. The method requires that the audio source be filtered with 2M eigen filters instead of just two left and right HRIRs.

The method illustrates the principle of linear superimposition inherent to the above HRIR representation and its utility in synthesizing multiple sound sources and multiple reflections rendered to listeners as a complex acoustic environment. When K audio signals at K different locations are synthesized for one listener's binaural presentation, each audio source is multiplied by M weights corresponding to the intended location of the signal and M output streams are obtained. Before sending the M streams to M EFs, the same process is repeated for the second source. The M streams of the second source are added to the M streams of the first M signals respectively. By repeating the same process for the rest of the K signals we have M summed signal streams. Then the M summed signal streams are convoluted with M EFs and finally summed to form a monaural output signal. Via the same process we can obtain the second monaural signal with the consideration of binaural difference if these two signals are used for binaural presentation. In this way, even there are K sources, the same amount of filtering, 2M EF, is needed. The increased cost is the weighting process. When M is a small number and K is large, the EF filter length, N, is greater than M, and the processing is efficient.

The present invention also provides an apparatus for reproducing three-dimensional sounds. The apparatus implements the signal modification method disclosed by the invention by using a filter array comprised of two or more filters to filter the signal by implementing the head-related impulse response.

Several different implementations of the apparatus of the present invention are disclosed. These architectures incorporate the necessary data structures and other processing units for implementing essential cues including HRIR filtering, ITD, IID, DIA, and DID between the sources and the listeners. In these architectures, a user interface is provided that allows the virtual sound environment authors to specify the parameters of the sound environment including listeners' positions and head orientations, sound source locations, room geometry, reflecting surface characteristics, and other factors. These specifications are subsequently input to a room acoustics model using imaging methods or other room acoustics models. The room acoustic model generates relative directions of each source and their reflective images with respect to the listeners. The azimuth and elevation angles are calculated with binaural difference in consideration for every possible combination of direct source, reflection image, and the listeners. Distance attenuation and acoustic delays are also calculated for each source and image with respect to each listener. FIFO buffers are introduced as important functional elements to simulate the room reverberence time and the tapped outputs from these buffers can thus simulate reflections of a source with delays by varying the tap output positions. Such buffers are also used as output buffers to collect multiple reflections in alternative embodiments. It is illustrated that room impulse responses that usually requires very long FIR filtration to simulate can be implemented using these FIFO buffers in conjunction with HRIR processing model for high efficiency.

The method and apparatus are extremely flexible and scaleable. For a given limited computing resource it is easy to trade the number of sources (and reflections) with the quality. The degradation in quality is graceful, without an abrupt performance change. The present invention can use off-the-shelf, economical multimedia DSP chips with a moderate amount of memory for VAES. The method and apparatus are also suitable for host-based implementations, for example, Pentium/MMX technology and a sound card without a separate DSP chip. The method and apparatus provide distributed computing architectures that can be implemented on various hardware or software/firmware computing platforms and their combinations for many other applications such as auditory display, loudspeaker array of DVD system virtualization, 3D-sound for game machines and stereo system enhancement, as well as new generations of sound recording and playback systems.

The invention has been implemented in several platforms running both off-line and in real-time. Objective and subjective testing has verified its validity. In a DVD speaker array virtualization implementation, the 5.1 speakers required for Dolby Digital sound presentation are replaced by two loudspeakers. The virtualized speakers are perceived as being accurately positioned at their intended locations. Headphone presentation also has similar performance. Subjects report distinctive and stable sound image 3D positioning and externalization.

Numerous objects, features and advantages of the present invention will be readily apparent to those of ordinary skill in the art upon a reading of the following detailed description of presently preferred, but nonetheless illustrative, embodiments of the present invention when taken in conjunction with the accompanying drawings.

BRIEF DESCRIPTION OF THE DRAWINGS

FIG. 2(*b*) is a plot of accumulated percentile variance represented by first M eigen values as function of M.

FIG. 3(*b*) is the same plot with the eigen filter length of 64 taps.

FIG. 4(*b*) is a block diagram of an alternative embodiment of the basic processing method for positioning a mono source with binaural output.

DESCRIPTION OF THE PREFERRED EMBODIMENTS

Figure 1A:
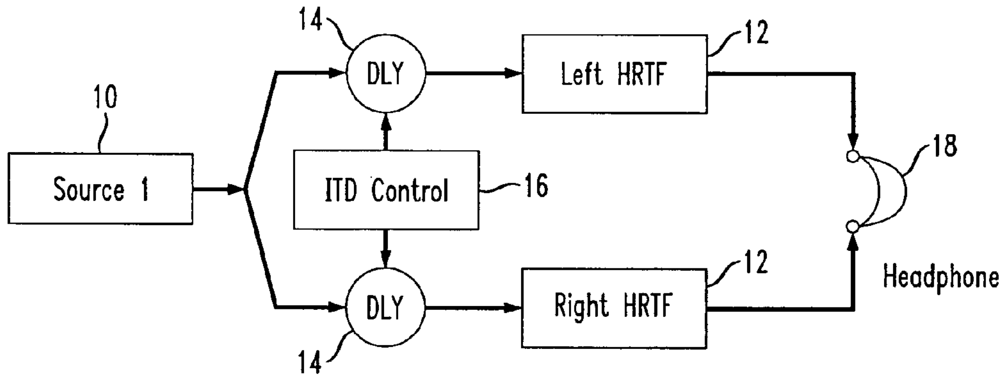
FIG. 1 is a block diagram of the current method known in the art for producing 3-D audio.
Figure 1B:
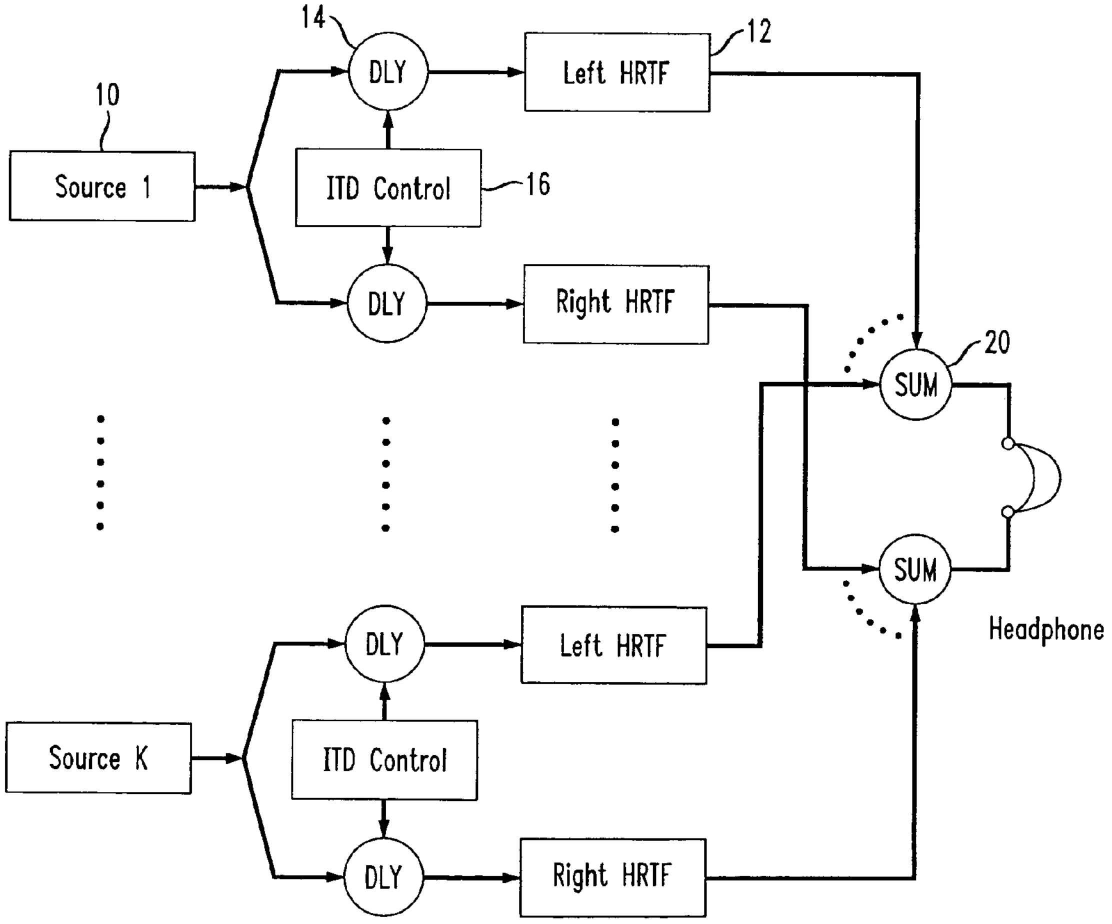

Referring now to the drawings, and particularly to FIG. 1, there is shown a 3-D sound system that uses technology known in the art. FIG. 1(*a*) illustrates a single source system where a single sound source 10 is delayed 14 by predetermined ITDs corresponding to left and right ear respectively and then convoluted with left and right HRTFs 12 to produce a binaural signal pair which is reproduced by a headphone 18. A minimum of two convolutions are required for such a scheme. Almost any off-the-shelf DSP can perform such task.

FIG. 1 (*b*) is a block diagram of a multiple source situation. In FIG. 1 (*b*), the computing load is proportional to the number of sources 10 simulated. For example, to render a 3-D sound image in a room with reasonable spatial impression, the reflections of the walls must be taken into account. Each reflected sound is also subject to HRTF filtering 12 as reflections usually come from different directions. If only the first order reflections are considered, there will be six additional sources to be simulated. This will increase the computing load by a factor of seven. If the secondary reflections are considered, then thirty-seven sources 10 need to be simulated. This method quickly exhausts the computing power of any commercially available, single-chip DSP processor. The same situation is encountered when multiple independent sources 10 are reproduced. To address this problem, methods known in the art use multiple DSPs in parallel. The use of multiple DSPs is inefficient, proportionally increasing system cost, size and operating temperature.

Eigen Filters (EFs) Design and Spatial Characteristic Function (SCFs) Derivation To derive the EFs and SCFs, acoustic signals recorded by microphones in both free-field and inserted into the ear canals of a human subject or a mannequin are measured. Free field recordings are made by putting the recording microphones at the virtual positions of the ears without the presence of the human subject or the mannequin; ear canal recordings are made as responses to a stimulus from a loudspeaker moving on a sphere at numerous positions. HRTFs are derived from the discrete Fourier Transform (DFT) of the ear canal recordings and the DFT of the free-field recordings. The HRIRs are further obtained by taking the inverse DFT of the HRTFs. Each derived HRIR includes a built-in delay. For a compact representation, this delay is removed. Alternative phase characteristics, like minimum phase, may be used to further reduce the effective time span of the HRIRs.

In a spherical coordinate system, sound source direction is described in relation to the listener by azimuth angle θ and elevation angle ϕ, with the front of the head of the listener defining the origin of the system. In the sound source direction coordinate system, azimuth increases in a clockwise direction from zero to 360°; elevation 90° degrees is straight upward and −90° degrees is directly downward. Expressing HRIR at direction i as an N-by-1 column vector $h(\theta_1, \phi_i)$=hi, a data covariance matrix can be defined as an N-by-N matrix, $$C = \sum_{i=1}^{I} D(\theta_i, \varphi_i)(h_i - h_{ave})(h_i - h_{ave})^T \quad (1)$$

Where T stands for transpose, I stands for the total number of measured HRIRs in consideration, and $D(\theta_i, \phi_i)$ is a weighting function which either emphasizes or de-emphasizes the relative contribution of the ith HRIR in the whole covariance matrix due to uneven spatial sampling in the measurement process or any other considerations. The term $h_{ave}$ is the weighted average of all $h_i$, i=1, . . . , I. When data are measured by placing a microphone at the position close to tympanic membrane this average component can be significant since it represents the unvarying contribution of ear canal to the measured HRIRs for all directions. When data are measured at the entrance of the ear canal with blocked meatus this component can be small. The HRIRs derived from such kind of data are similar to the definition of directional transfer functions (DTFs) known in the art. The term $h_{ave}$ is a constant; adding or omitting it does not affect the derivation, so it is ignored in the following discussion.

While HRIR measured at different directions are different, some similarity exists between them. This leads to a theory that HRIRs are laid in a subspace with dimension of M when each HRIR is represented by an N-by-1 vector. If M<<N, then a M-by-1 vector may be used to represent the HRIR, provided that the error is insignificant. That is, the I measured HRIRs can be thought as I points in an N-dimensional space, however, they are clustered in a M-dimensional subspace. If a set of new axes $q_i$, i=1, . . . , M of this subspace can be found, then each HRIR can be represented as M-by-1 vector with each element of this vector being its projection onto $q_i$, i=1, . . . , M. This speculation is verified by applying eigen analysis to the sample covariance matrix consisting of 614 measured HRIRs on a sphere.

Figure 2A:
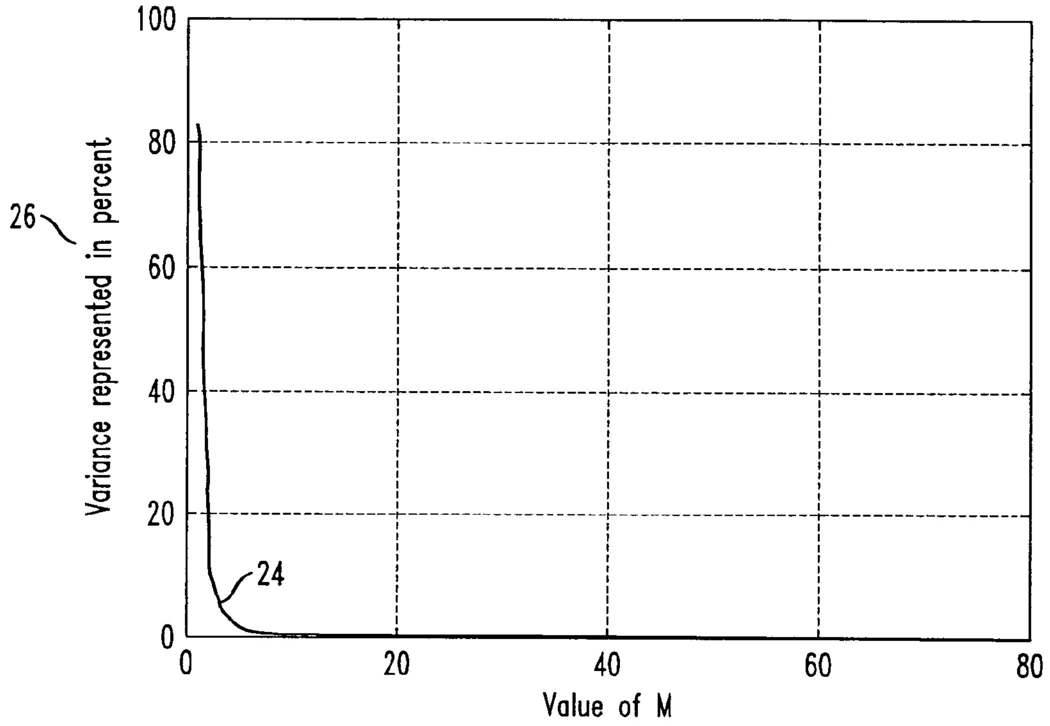
FIG. 2 (*a*) is a plot showing the eigen value distribution of the HRIR data covariance matrix. It represents the covariance of all the HRIRs projected on each eigen vector.
Figure 2B:
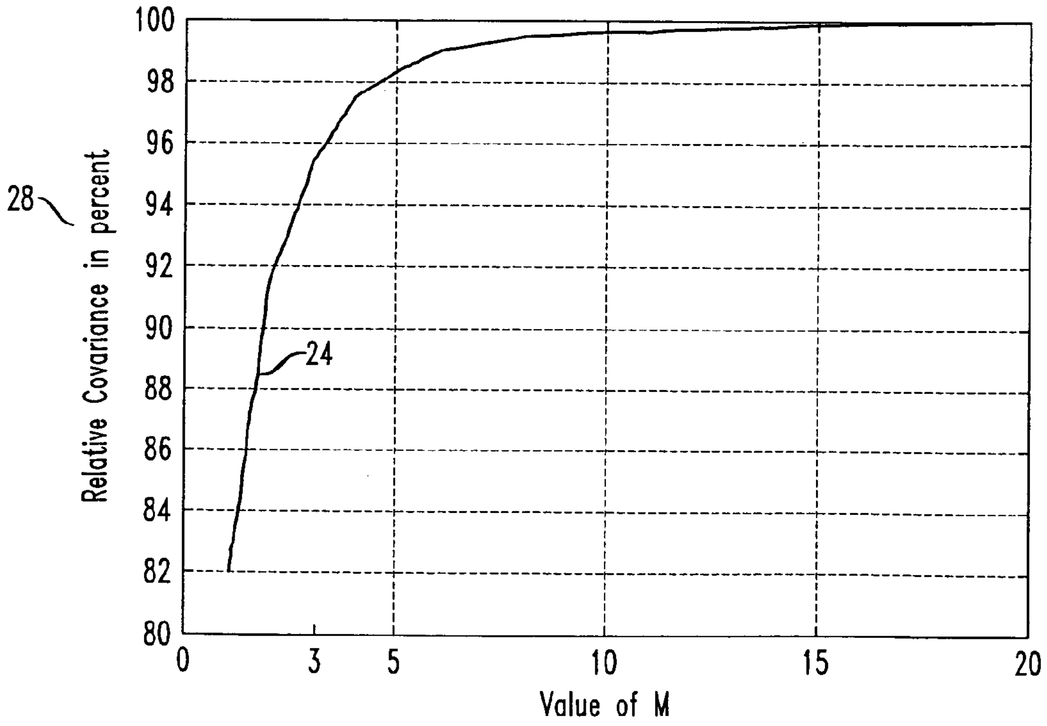

Turning now to FIG. 2(*a*), there is depicted therein the eigen values 24 of the HRIR sample covariance matrix, that is, or the variance projected on each eigen vector of HRIR sample covariance matrix on a percentile base 26, arranged orderly according to their magnitude. The graph shows that first few eigen values 24 represent most of the variations 26 contained in all 614 HRIRs. These HRIRs are measured on a 10-degree grid on the sphere. Doubling the density of HRIR sampling on the sphere thereby using all HRIRs sampled on a 5-degree grid with total of 2376 HRIRs to construct the covariance matrix does not significantly change the distribution of this eigen value plot. This demonstrates that a 10-degree sampling is adequate to represent the variations contained the HRIRs on the whole sphere.

FIG. 2(*b*) is a plot of the value of M versus its relative covariance 28. The covariance 28 is represented by the sum of first M eigen values 24 as a function of M. This graph illustrates that the first 3 eigen vectors 22 cover 95%, the first 10 have 99.6%, and the first 16 eigen vectors 26 contain 99.9% of the variance contained in all 614 HRIRs. The mean square error for using the first M eigen vectors to represent the 614 HRIRs is:

$$e^2 = \sum_{m=M+1}^{N} \lambda_m \tag{2}$$

where $\lambda_m$, m=M+1, . . . , N are the eigen values with corresponding eigen vectors outside of the subspace. In accordance with the above criterion, the first most significant M eigen vectors are selected as the eigen filters for HRIR space and represent the axes of the subspace. Therefore, each of the I measured HRIR can be approximated as a linear combination of these vectors:

$$\hat{h}(\theta_i, \varphi_i) = \sum_{m=1}^{M} w_m(\theta_i \varphi_i) q_m,\ i = 1, \ldots, I \tag{3}$$

where $w_m$, m=1, . . . , M are the weights obtained by back projection, that is, $$w_m(\theta_i, \phi_i) = h(\theta_i, \phi_i) q_m^T i=1, \ldots, I \tag{4}$$

Consequently, in the subspace spanned by the M eigen vectors, each HRIR can be represented by an M-by-1 vector.

The above process not only produces a subset of parameters that represents measured HRIRs in an economical fashion, but also introduces a functional model for HRIR based on a sphere surrounding a listener. This is done by considering each set of weights $w_m(\theta_i, \phi_i)$, i=1, . . . ,I as discrete samples of a continuous weight function $w_m(\theta, \phi)$. Applying a two-dimensional interpolation to these discrete samples we can get such M continuous functions. These weighting functions are only dependent upon azimuth and elevation, and thus termed spatial characteristic functions (SCFs). In the present invention, the spatial variations of a modeled HRIR are uniquely represented by weighting functions for a given set of $q_m(n)$, m=1, . . . , M,. This definition allows a spatially continuous HRIR to be synthesized as:

$$h(n, \theta, \varphi) = \sum_{m=1}^{M} w_m(\theta, \varphi) q_m(n), \tag{5}$$

where $q_m(n)$ is the scalar form of $q_m$. In this expression a tri-variate function HRIR is expressed as a linear combination of a set of bi-variate functions (SCFs) and a set of uni-variate functions (EFs). Eq.(5) takes the form of a Karhunen-Loeve Expansion.

There are many methods to derive continuous SCFs from the discrete sample sets, including two-dimensional FFT and spherical harmonics. One embodiment of the present invention uses a generalized spline model. The generalized spline interpolates the SCF function from discrete samples and applies a controllable degree of smoothing on the samples such that a regression model can be derived. In addition, a spline model can use discrete samples which are randomly distributed in space. The Eq. (5) can be rewritten in a vector form:

$$h(\theta, \varphi) = \sum_{m=1}^{M} w_m(\theta, \varphi) q_m. \tag{6}$$

Eqs. (5) and (6) accomplish a temporal attributes and spatial attributes separation. This separation provides the foundation for a mathematical model for efficient processing of HRIR filtering for multiple sound sources. It also provides a computation model for distributed processing such that temporal processing and spatial processing can be easily divided into two or more parts and can be implemented on different platforms. Eqs. (5) and (6) are termed spatial feature extraction and regularization (SFER) model of HRIRs.

The SFER model of HRIR allows the present invention to provide a high efficiency processing engine for multiple sound sources. When s(n) represents a sound source to be positioned, y(n) represents a output signal processed by HRIR filter, and h(n, θ, ϕ) is the HRIRs used to position the source at spatial direction (θ, ϕ), then, according to Eq. (5), $$y(n) = s(n) * h(n, \theta, \varphi) \tag{7a}$$

$$= s(n) * \sum_{m=1}^{M} w_m(\theta, \varphi) q_m(n) \tag{7b}$$

$$= \sum_{m=1}^{M} [s(n) w_m(\theta, \varphi)] * q_m(n) \tag{7c}$$

$$= \sum_{m=1}^{M} [s(n) * q_m(n)] w_m(\theta, \varphi) \tag{7d}$$

Eqs. (7c) and (7d) are M times more expensive computationally than the direct convolution Eq. (7a). But when two signals $s_1(n)$ and $s_2(n)$ are sourced at two different directions $(\theta_1, \phi_1)$ and $(\theta_2, \phi_2)$ respectively, the output is $$y(n) = s_1(n) * h(n, \theta_1, \varphi_1) + s_2(n) * h(n, \theta_2, \varphi_2) \tag{8a}$$

$$= s_1(n) * \sum_{m=1}^{M} w_m(\theta_1 \varphi_1) q_m(n) + s_2(n) * \sum_{m=1}^{M} w_m(\theta_2, \varphi_2) q_m(n) \tag{8b}$$

$$= \sum_{m=1}^{M} [w_m(\theta_1, \varphi_1) s_1(n) + w_m(\theta_2, \varphi_2) s_2(n)] * q_m(n) \tag{8c}$$

where $h(n, \theta_1, \phi_1)$ and $h(n, \theta_2, \phi_2)$ represent the corresponding HRIRs. Compared with Eq. (7c), Eq. (8c) does not double the number of convolutions even though the number of sources and HRIRs are doubled, instead, it adds M multiplications and(M−1) additions.

Eq. (8c) can be immediately extended to multiple sources case. K independent sources at different spatial locations can be rendered to form a one ear output signal which is the summation of each source convoluted with its respective HRIR:

$$y(n) = s_1(n)*h(n,\theta_1,\varphi_1) + s_2(n)*h(n,\theta_2,\varphi_2) + \ldots + s_k(n)*h(n,\theta_k,\varphi_k) \tag{9a}$$

$$= \sum_{k=1}^{K} s_k(n) * \sum_{m=1}^{M} w_m(\theta_k,\varphi_k) q_m(n) \tag{9b}$$

$$= \sum_{m=1}^{M} \left[ \sum_{k=l}^{K} w_m(\theta_k,\varphi_k) s_k(n) \right] * q_m(n). \tag{9c}$$

In Eq. (9c), the inner sum takes K multiplications and (K−1) additions. For a DSP processor featuring multiplication-accumulation instruction it takes K instructions to finish the inner sum loop. If each $q_m$ (n) has N taps, then the convolution takes N instructions to finish. Therefore the total number of instructions needed for summing over m is M(N+K). In contrast, the direct convolution will need KN instructions. The improvement ratio η is, $$\eta = \frac{KN}{M(N+K)}.$$

For a moderate size of K, (2≦K≦1000), η is a function of all the parameters M, N, and K. When K—inf., Θ→N/M.

Figure 3A:
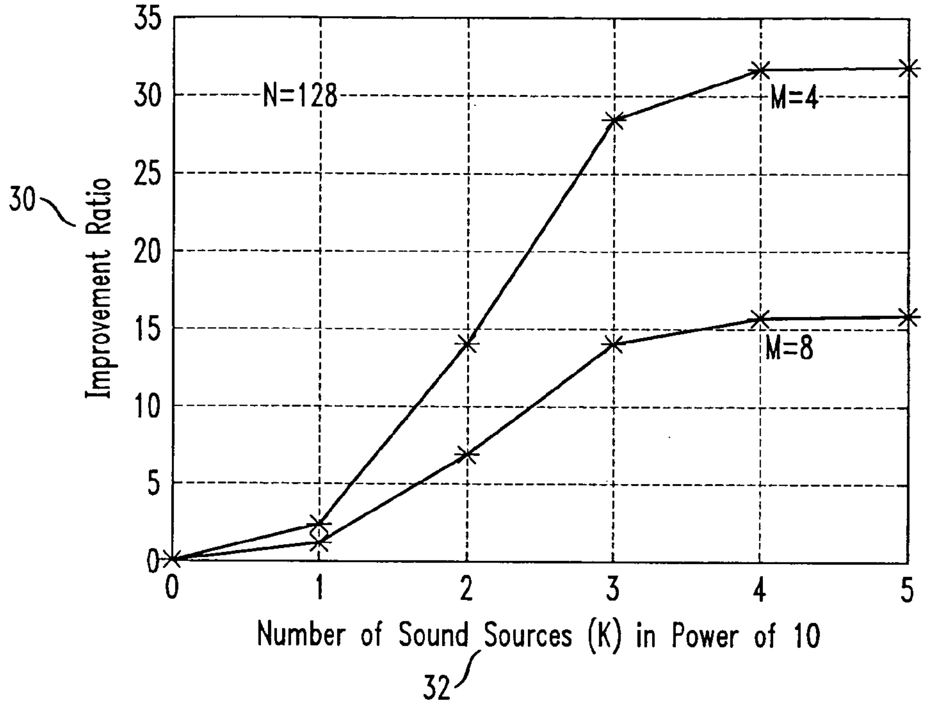
FIG. 3(*a*) is the plot of improvement ratio of computation efficiency of the method of the present invention vs. direct convolution with eigen filter length of 128 taps.
Figure 3B:
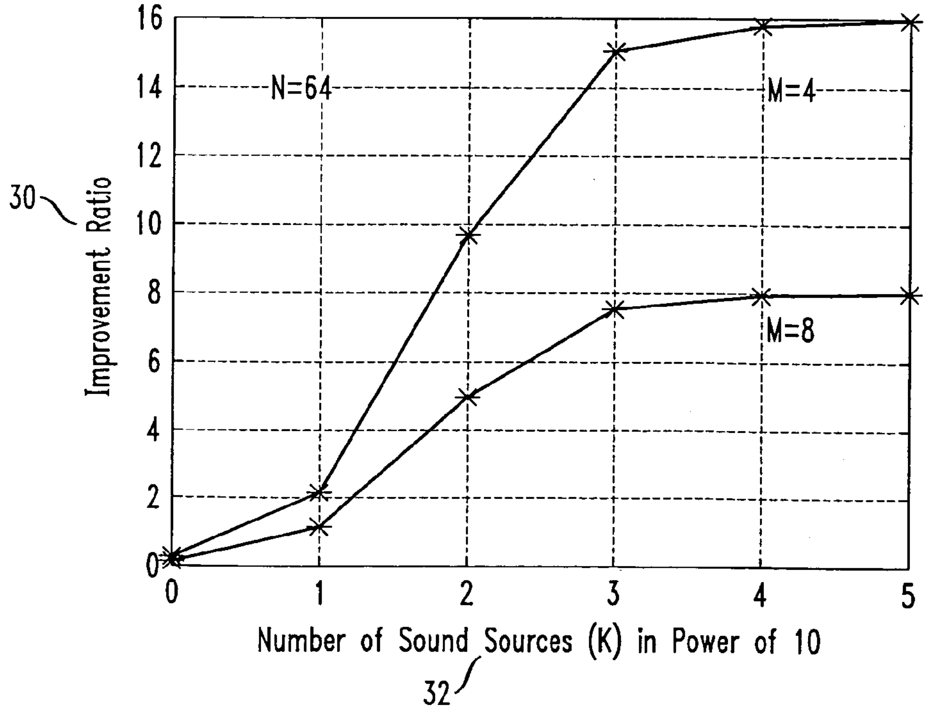

Turning then to FIG. 3, there are depicted graphs of the improvement ratio 30 of the present invention as a function of the number of sound sources 32. The improvement ratio η 30 is a function of the number of sound sources K 32 with both M and N as parameters. The present invention uses Eq. (9c) and performs M convolutions regardless of how many sources are rendered. Each source it requires M multiplications and (M−1) additions. If K<M, Eq. (9c) is less efficient than the present methods described by Eq. (6a). However, if K≧M, the method of the present invention, Eq. (9c), is more efficient than the present method, described by Eq. (6a). When K is significantly larger than M, the advantages of the present invention in synthesizing multiple sound source and reflections are substantial.

FIG. 3(*a*) depicts computation efficiency improvement ratio for N=128 which is usually used when the sampling rate is 44.1 or 48 kHz. FIG. 3(*b*) is the case where N=64, common for a sampling rate of 22.05 or 24 kHz. Both cases of M=4 34 and M=8 36 are shown. In general, M≦N. The larger the M is, the higher the quality of SFER model: the synthesized HRIR more closely approximates the measured HRIR as M increases. Initial testing supports using an M value between 2 and 10. This range yields an HRIR performance from acceptable to excellent. To further quantitatively illustrate this improvement, Table 1 compares direct convolution of existing methods and the SFER model method for different number of signal sources.

In Table 1, the minimum case of K is 2, representing a simple 3D-sound positioning system with one source and binaural outputs. For a moderate VAES simulation, several sources with first order and perhaps second order room reflections are considered. For example, four sources with second order reflections included results in total 2×(4+4×(6+36))=344 sources and reflections to be simulated for both ears. If direct convolution is used, 22016 instructions for each sample at a sampling rate of 22.05 kHz are required, which is equivalent to 485 MIPS computing load. This is beyond the capacity of any single processor currently available. However, using the present invention, only 3264 instructions are needed per sample when M=8, which is equivalent to 72 MIPS. If M=4, then only 36 MIPS are needed. This allows many off-the-shelf single DSP processors to be used.

TABLE 1

Comparison of number of instructions for HRIR filtering between direct convolution and SFER model

| | N = 64 | | | N = 128 | | |
|---|---|---|---|---|---|---|
| | | SFER | | | SFER | |
| K | Dirc. Conv. | M = 8 | M = 4 | Dirc. Conv. | M = 8 | M = 4 |
| 2 | 128 | 528 | 264 | 256 | 1,040 | 520 |
| 10 | 640 | 592 | 296 | 1,280 | 1,104 | 552 |
| 100 | 6,400 | 1,312 | 656 | 12,800 | 1,824 | 912 |
| 1,000 | 64,000 | 8,512 | 4,256 | 128,000 | 9,024 | 4,512 |
| 10,000 | 640,000 | 80,512 | 40,256 | 1,280,000 | 81,024 | 40,512 |
| 100,000 | 6,400,000 | 800,512 | 400,256 | 12,800,000 | 801,024 | 400,512 |

Embodiment of a Basic System for One Source and One Listener

The simplest system needs to virtualize one source with binaural outputs for one listener. In this system, all the three cues including ITD, IID, and HRIR filtering are considered. The HRIR filters are derived from Eq. (7) as follows:

$$y_L(n) = s(n) * \sum_{m=1}^{M} w_m(\theta_L,\varphi_L) q_m(n), \tag{10}$$

-continued $$= \sum_{m=1}^{M} [w_m(\theta_L, \varphi_L)s(n)] * q_m(n), \quad (10a)$$

$$= \sum_{m=1}^{M} [s(n) * q_m(n)]w_m(\theta_L, \varphi_L), \quad (10b)$$

where $y_L(n)$ stands for the output to the listener's left ear, $w_m(\theta_L, \phi_L)$, m=1, . . . ,M is the weight set that synthesizes a HRIR corresponding to the listener's left ear with respect to the source s(n). Likewise the output to the right ear is:

$$y_R(n) = s(n) * \sum_{m=1}^{M} w_m(\theta_R, \varphi_R)q_m(n), \quad (11)$$

$$= \sum_{m=1}^{M} [w_m(\theta_R, \varphi_R)s(n)] * q_m(n), \quad (11a)$$

$$= \sum_{m=1}^{M} [s(n) * q_m(n)]w_m(\theta_R, \varphi_R). \quad (11b)$$

The Eqs. (10a), (10b), (11a), and (11b) suggest two alternative embodiments.

Figure 4A:
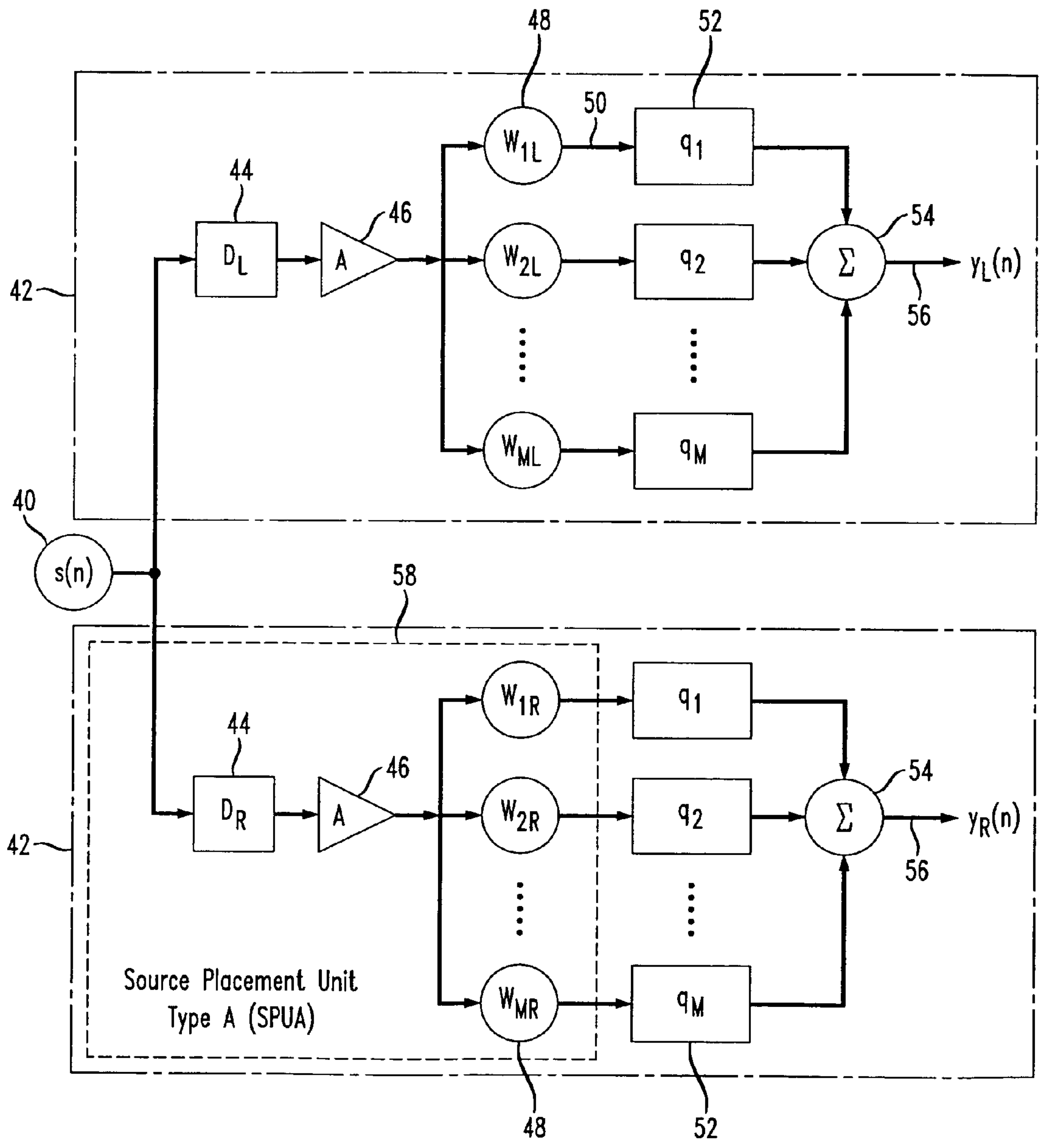
FIG. 4 (*a*) is a block diagram illustrating the basic processing method of SFER model for positioning a mono source with binaural output.
Figure 4B:
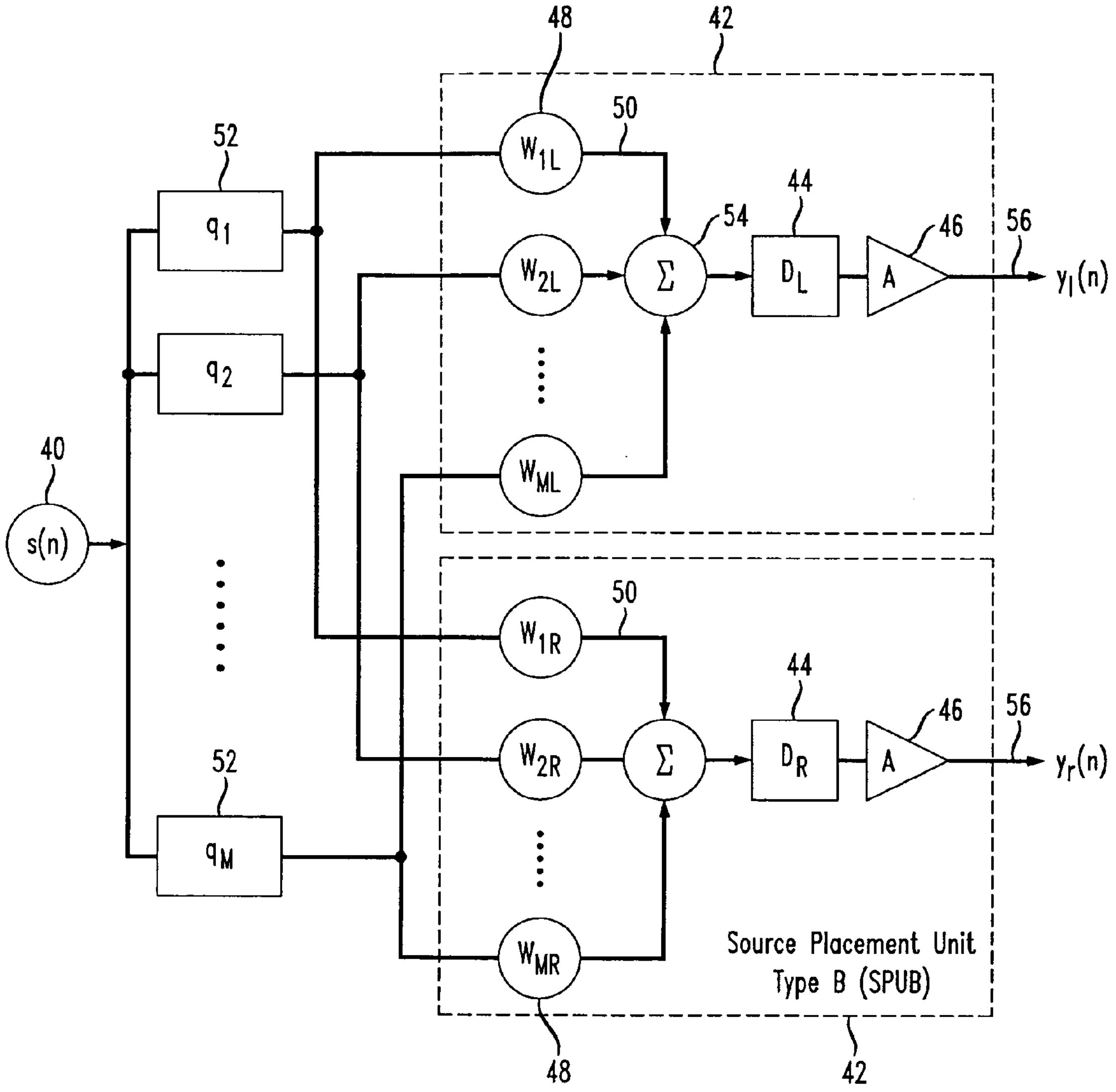

Turning now to FIG. 4(*a*), an embodiment of the present invention based on Eqs. (10a) and (11a) is depicted. In this implementation, a mono signal 40 is sent to two channels 42, where each channel 42 directs sound to a single ear. The signal is delayed by a delay buffer 44, attenuated by an attenuator 46, and then weighted by weights 48. M intermediate results 50 coming out of the weights 48 are fed into M eigen filters 52 and passed to a summer 54 for left and right ear outputs 56, respectively. According to Eqs. (10a) and (11a) the difference in HRIR processing between two ears is uniquely represented by the weights 52. When a sound source is not in the median plane, the sound arrives at both ears with binaural difference; therefore, two separate channels 42 are required. Considering that when the relative movement between the source and the listener occurs, the eigen filter banks remain constant and all other elements have to respond to the change, the combination of delay 44, attenuator 46, and weights 48 form a source placement unit (SPU) 58. In this particular implementation, SPU 58 has one input 40 and M outputs 50. This SPU 58 is defined as SPU type A (SPUA). Two such SPUAs are required to place the source for two ears individually. To maintain this binaural difference, two separate filter banks consisting of eigen filters 52 are responsible for left and right ears. Though shown here the case of one source, this embodiment is useful for multiple inputs 40 and places the delay 44, attenuation, 46, and weighting systems 48 prior to the eigen filter banks 52. Therefore, all the sources get their relative timing and intensity coded before they are globally processed by EFs. However, the embodiment requires two channels 42 to separate the binaural path to keep all the sources have correct time and intensity relationship between two ears.

In FIG. 4(*b*), an alternative embodiment of the present invention is depicted. In the embodiment of FIG. 4(*b*), binaural outputs 56 are synthesized in accordance with the formula of Eqs. (10b) and (11b). As the convolution parts are the same for (10b) and (11b), one bank of eigen filters 52 is used. The signal 40 to be positioned is first convolved with all M eigen filters 52 to form M filtered versions 58 of the source signal. Then these M signals 58 are fed into two channels 42, each having a set of weights 48, representing the spatial characteristics of left and right HRIR, respectively. In each channel 42, the weighted signals 50 are combined by a summer 54, then are delayed 44 and attenuated 46 to form left and right ar outputs. The combination of weights, 48 summer 54, delay 44, and attenuator 46 is also a SPU 58. However, in this configuration, the SPU 58 has M inputs and one output, thus it is termed as SPU type B (SPUB). The implementation uses only one set of eigen filters 52 to output 56, any number of outputs, provided each output has its own SPUB. This embodiment is limited to one single input 40. If more than one input 40 is applied to the eigen vectors 52, the relative timing with respect to the listener is destroyed. The embodiment of FIG. 4(*b*) is optimized for synthesizing one source with many reflections for one or more listeners.

Embodiment of VAES with Multiple Sources and Multiple Reflections.

Figure 5A:
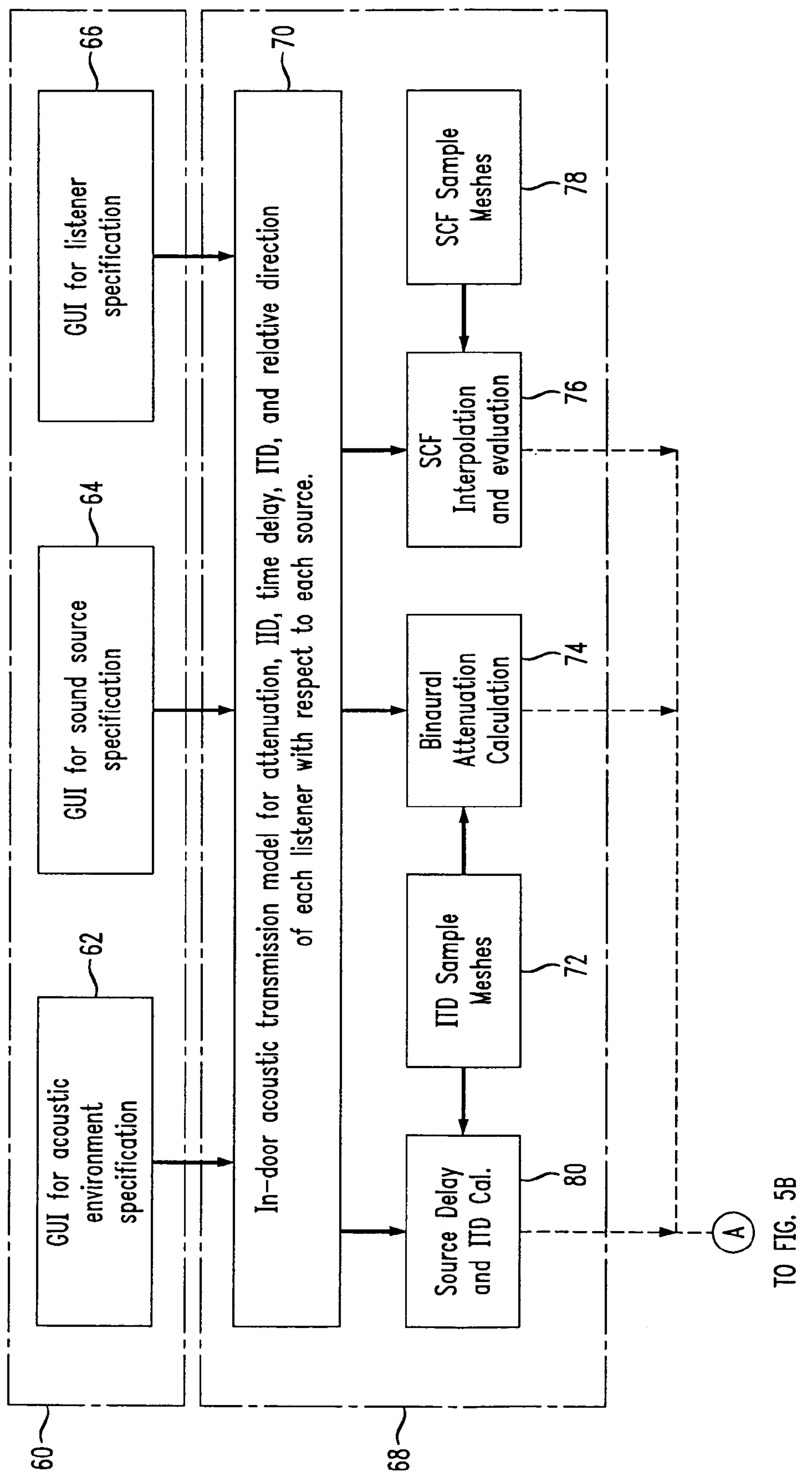
FIG. 5 is a block diagram of an embodiment of VAES with multiple source 3D positioning without echoes.
Figure 5B:
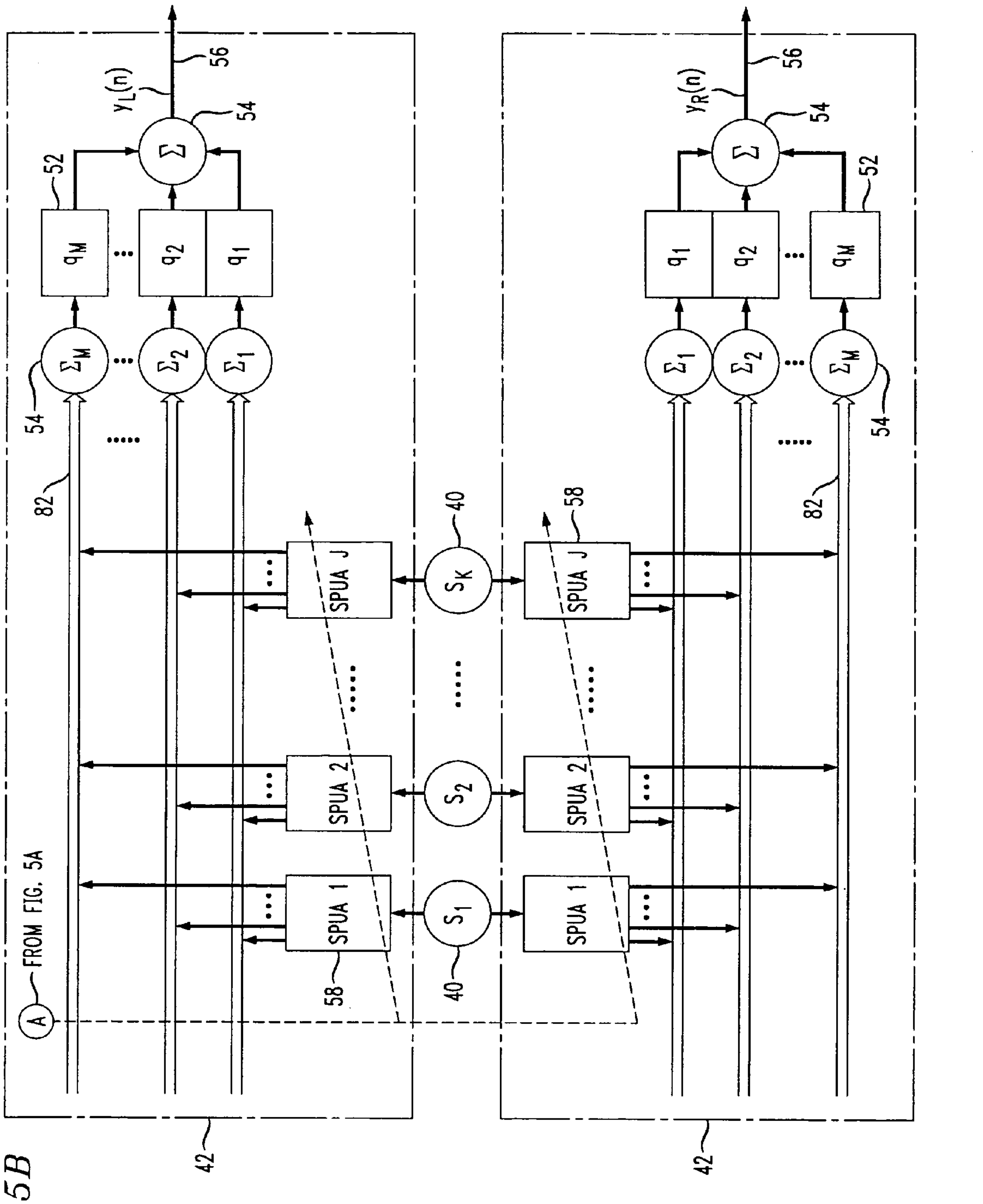

FIG. 5 depicts an embodiment of the present invention for independent, multiple-sound-source 3D synthesis. This acoustic environment is for multiple sound sources active in an environment where no reflections are present. Examples of such an environment are voice and/or music presentations in an open area such as a beach or a ski area, or simulating multiple sources in an anechoic chamber. It is also preferred in some applications where the VAES designer does not want echoes, such as the case of multi-party teleconferencing.

In the embodiment of FIG. 5, user interface form a collective environment input 60, to allow the VAES designer to input a variety of parameters. In the environment input 60 depicted, environment parameters input 62 allows sound media such as air or water, and a world coordinate system, to be specified. A sound source specification 64 includes positions (x,y,z) for all sources, the radiation pattern of each source, relative volume, moving velocity, direction, and can also include other parameters. A listener position input 66 allows the listener coordinates (x,y,z), head orientations, direction of movement and velocity to be input, and can also include additional parameters. All information is fed into a calculator 68, which consists of several different elements. A processor 70 determines relative angles (in terms of azimuth and elevation), IIDs, ITDs between each source and each listener, and attenuation and time delay due to distance between the listener and each source. A ITD sample mesh storage 72 stores the derived ITD data meshes on the sphere. Attenuations are calculated in an attenuation determinator 74 using the data from ITD sample mesh storage 72 and source distance from 70. Relative angles of azimuth and elevation are passed to the SCF interpretation and evaluator 76. The SCF interpretation and evaluator 76 uses data from an SCF sample mesh 78 to derive the weight sets for each source-listener pair. These results of the calculator 68 are sent to SPUAs 58 and are used to dynamically control the SPUAs 58. K sources 40 feed into K SPUA 58 blocks respectively. There are two sound channels 42 for binaural sound. In each channel, SPUAs code K sources 40 and associated respective spatial information from the calculator to create K groups of output signals sent to data buses 82. The data buses 82 regroup the SPUA signals and send them into M summers 54. The outputs of M summers are sent to M eigen filters 52 for temporal processing. The M filtered signals are summed together by an output summer 54 forming the output 56 for each channel.

The embodiment of FIG. 5 requires two banks of eigen filters 52 to provide a pair of outputs 54, one for each ear of the listener. The IID information may be coded into weights such that the attenuator in SPUA only has to process the attenuation created by source-listener distance. The output 56, a pair of binaural signals, are good for any number of listeners as long as they are assumed to be at the same spatial location in the environment. The length of each eigen filter N 52, the value of M, and the value of K can be adjusted for processing flexibility.

Figure 6A:
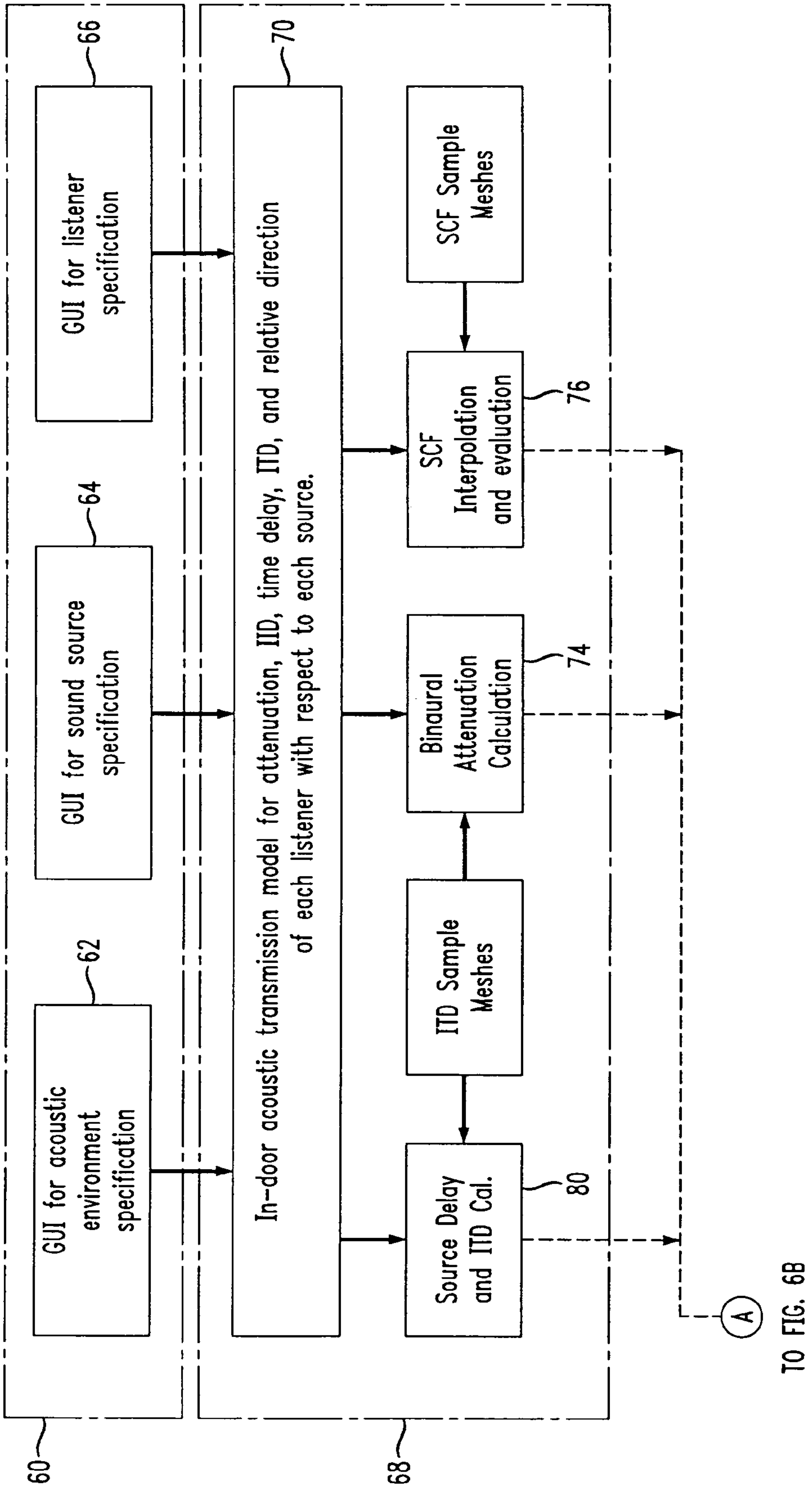
FIG. 6 is a block diagram of an embodiment of VAES with multiple sources and multiple reflections for sound source 3D positioning.
Figure 6B:
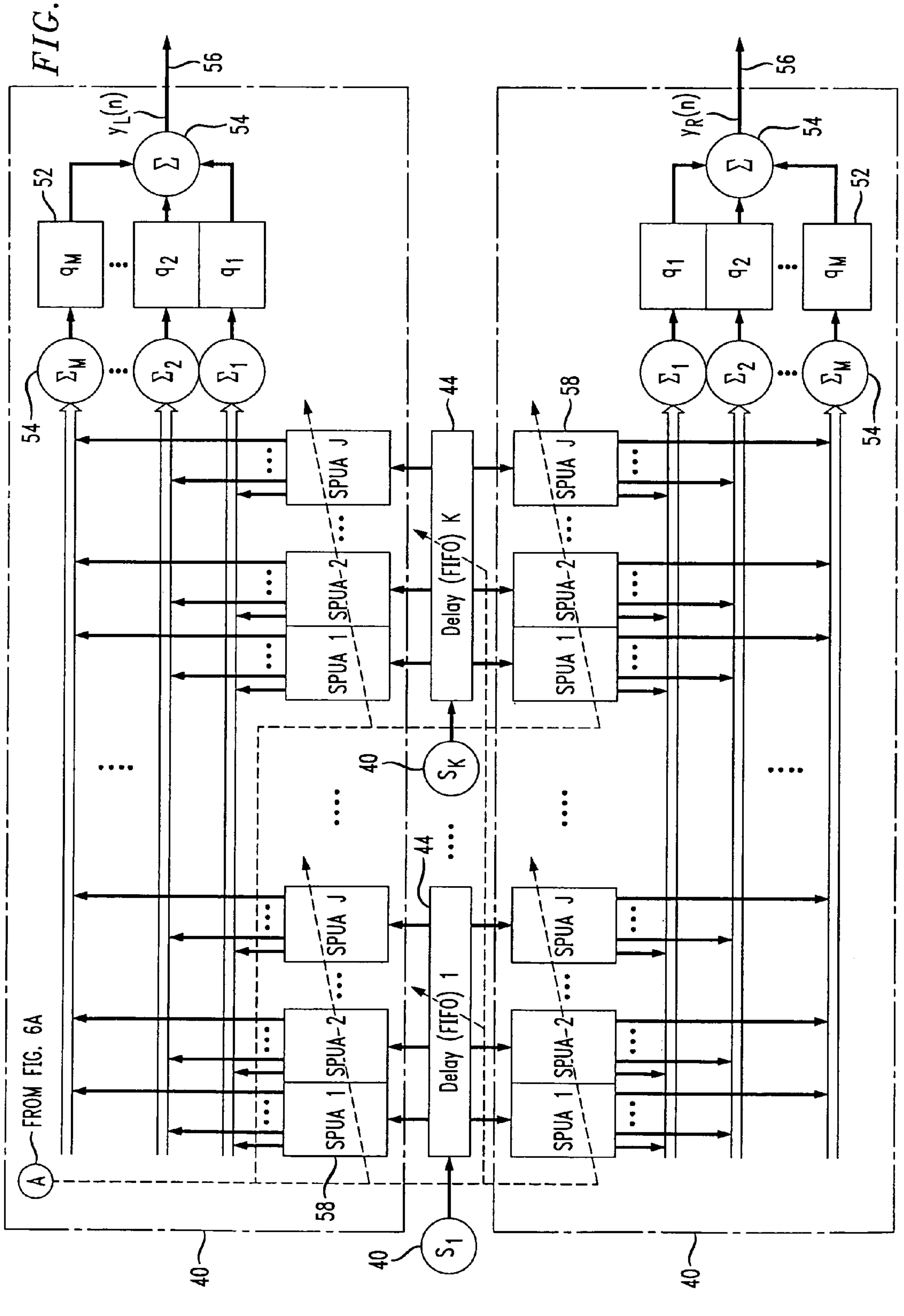

FIG. 6 illustrates an embodiment of the present invention for simulating an acoustic enclosure such as a room with six reflective surfaces. The echoes introduced by these surfaces related to each independent source must be considered for 3D positioning as well. To describe the interactions between each source and each wall, an image model method is used. Image models for room acoustics modeling are known in the art. Image model considers a reflection of a particular source from a wall as an image of the source at another side of the wall at an equal distance. The wall is treated like an acoustic mirror. For a room with six surfaces each independent source will simultaneously introduces six images of the first order reflections. When a source moves, so does its images and hence all the images have to be dynamically positioned as well. Furthermore, if secondary reflections, that is the reflections of each image, are considered, the total number of sources and images increases exponentially.

The embodiment presented in FIG. 6 takes K sound sources, each with J reflections, as input and then positions the sources and reflections in 3-D space. The environment input 60 and calculator 68 are similar to the environment input and calculator in FIG. 5. In addition to the features already discussed in describing the embodiment of FIG. 5, the acoustic environment input 62 allows the VAES designer to specify the reflection coefficients of walls, and the processor 70 calculates the angles between each source, their reflection images and each listener, and all the attenuations including the reflection coefficient of each wall involved, in addition to all the other parameters that describe the acoustic relationship between the sources (images) and the listeners. The delay and ITD control signal is output from the delay calculator 80, and combined with the output from the attenuation calculator 74 and the SCF interpolator 76 output, which compromise the HRIRs. The combined control signals and weights from the calculator 68 are sent to the channels 42. The SPUAs 58 are responsible for source and image placement, and have an output structure similar to the structure described in FIG. 5, with one addition. There is a set of FIFO buffers 44 attached to each independent source input 40 which serve to introduce delays of K. These FIFO buffers 44 represent the room acoustic delay. The delayed signals that corresponding to modeled image delay is taken out from appropriate taps of each FIFO buffer 44. Each output of the tap-delayed signal is placed by its own SPUA 58. A source with J reflections will form J+1 tap outputs from each delay buffer 44, for a total of K(J+1) SPUAs 58 for each ear. As each SPUA 58 outputs M output signals, the signals are regrouped by summers 54 to form total of M summed filtered signals. Each of these filtered signals is a summation of K(J+1) signals from the SPUAs 58. Each channel 42 creates an output 56 for a single speaker. Note that the number J reflections associated with each independent source are not necessarily the same and hence the overall number of sources to be placed may vary.

VAES with one Source and Multiple Reflections

Figure 7A:
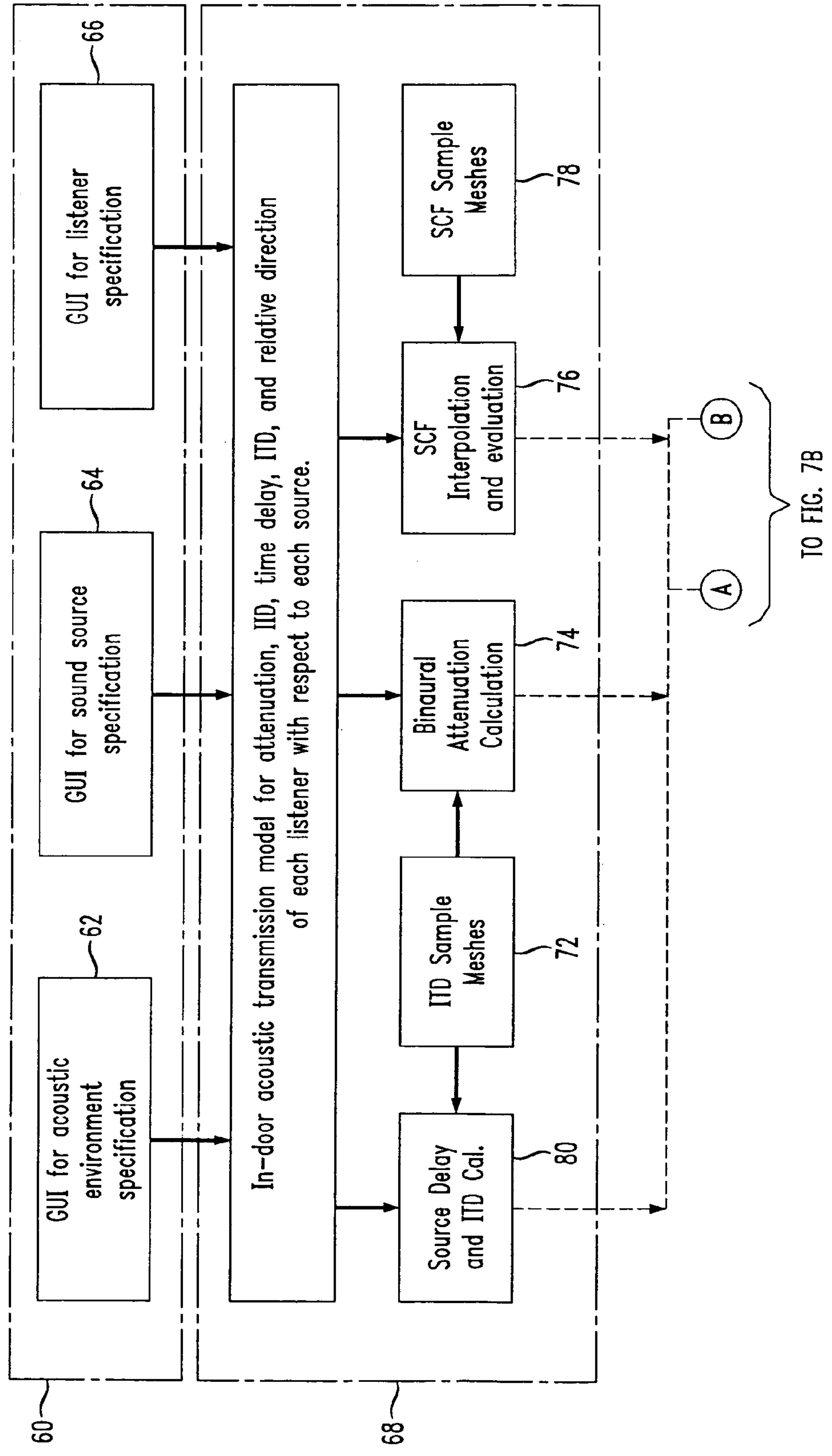
FIG. 7 is a block diagram of an embodiment of VAES with one source but multiple reflections.
Figure 7B:
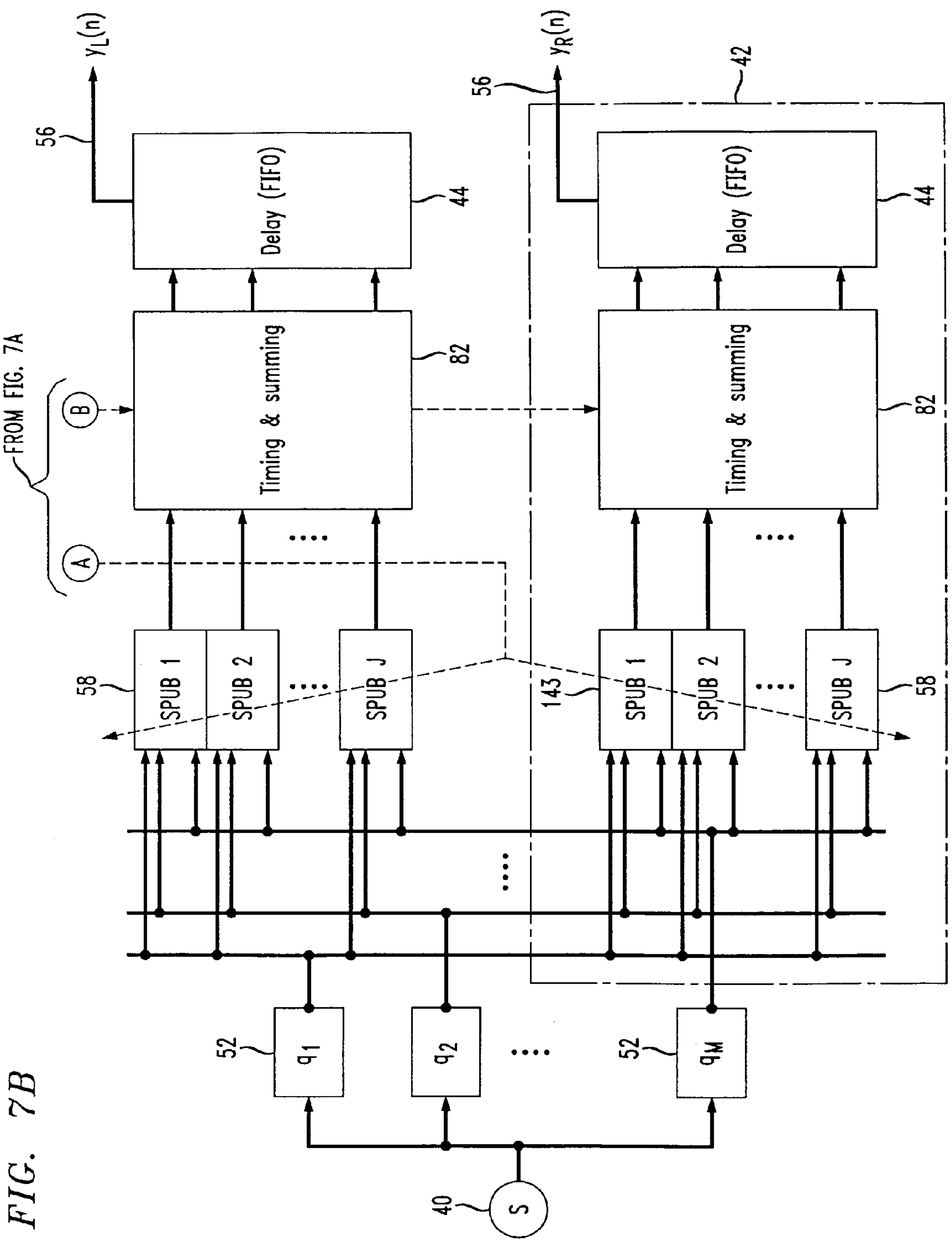

FIG. 7 illustrates an embodiment of the apparatus of the present invention optimized for a single source with multiple reflections. When only one source, or multiple sources that can be combined into a single source, is present in an acoustic enclosure, all its images are the delayed and attenuated versions of the source itself. An apparatus architecture that further reduces computations is suggested by this characteristic.

If y(n) represents a monaural output signal to one ear, without discretion of left and right channels, then:

$$y(n)=s(n-\tau_0)*h(n,\ \theta_0,\ \phi_0)+s(n-\tau_1)*h(n,\ \theta_1,\ \phi_1)+\ .\ .\ .\ +s(n-\tau_J)*h(n,\ \theta_J,\ \phi_J) \quad (12a)$$

$$y(n) = s(n-\tau_0)*h(n, \theta_0, \varphi_0) + s(n-\tau_1)*h(n, \theta_1, \varphi_1) + \dots + s(n-\tau_J)*h(n, \theta_J, \varphi_J) \quad (12a)$$

$$= \sum_{j=0}^{J} s(n-\tau_j)*h(n, \theta_j, \varphi_j) \quad (12b)$$

where $s(n-\tau_0)$ represents the source and $s(n-\tau_j)$, j=1, . . . , J represent the images. The location of the source is coded by convoluting these delayed signal with their respective $h(n, \theta_j, \phi_j)$, j=0, . . . , J. Substituting $h(n, \theta_j, \phi_j)$ with its SFER model representation, we Eq. (12) becomes:

$$y(n) = \sum_{j=0}^{J} s(n-\tau_j)*\sum_{m=1}^{M} w_m(\theta_j, \varphi_j)q_m(n) \quad (13a)$$

$$= \sum_{j=0}^{J}\sum_{m=1}^{M} s(n-\tau_j)*q_m(n)w_m(\theta_j, \varphi_j) \quad (13b)$$

The Z-transform of above yields:

$$Y(Z) = \sum_{j=0}^{J}\sum_{m=1}^{M} S(Z)Z^{-\tau_j}Q_m(Z)w_m(\theta_j, \varphi_j) = \sum_{j=0}^{J}\left[\sum_{m=1}^{M} S(Z)Q_m(Z)w_m(\theta_j, \varphi_j)\right]Z^{-\tau_j} = \sum_{j=0}^{J}\left[\sum_{m=1}^{M} R_m(Z, \theta_j, \varphi_j)\right]Z^{-\tau_j} \quad (14)$$

where $S(Z)Z^{-\tau_j}$ is the Z-transform of $s(n-\tau_j)$ and $Q_m(Z)$ is the Z-transform of $q_m(n)$, and $$R_m(Z, \theta_j, \varphi_j) = \sum_{m=1}^{M} S(Z)Q_m(Z)w_m(\theta_j, \varphi_j).$$

Eq. (14) suggests the delay can be implemented after convolution and weighting and this leads to an alternative implementation in which only one set of EF filters are needed, thus further reducing the number of convolutions involved.

Returning to FIG. 7, the environment input 60 and calculator 68 remain the same as in FIG. 6. However, a single sound signal input 40 convolutes with M eigen filters to generate M intermediate signals. Placement of the direct sound and its echoes are performed by using multiple SPUBs 58 which weight the M inputs and produces (J+1) outputs in each channel. Each one of these outputs has its own delay with respect to the direct sound because of room acoustic transmission, therefore the signals are time-aligned and grouped by the summer-timers 82. A FIFO buffer delay 44 generates the proper delay and to produce one signal corresponding to the direct sound and echo. The length of each delay depends upon the required maximum delay and the sampling rate. The same process is applied to both a left and right channel to produce binaural outputs 56. This embodiment requires only one set of eigen filters 52, and thus the computation load is cut by almost half at a price of adding a single FIFO buffer 44.

For multiple listeners in an acoustic environment, two major cases are considered. For one situation all the listeners are assumed to be at one location, for example, multi-party movie watching. For this application, the embodiments of FIG. 5 through FIG. 7 can produce multiple outputs of the left and right channels for each listener when the listeners are using headphones. If the output is via loudspeakers, the loudspeaker presentation should also include cross-talk cancellation techniques known in the art. A second multiple-listener situation arises when each listener has an individual spatial perspective, for example, a multi-party game. If only a single sound source is reproduced, each listener requires one SPUB/delay combo, which is a single channel of output in FIG. 6. However, no matter how many listeners are present only one set of eigen filters is required. If multiple sources are to be presented to multiple users with individual spatial perspectives, each listener will require an apparatus similar to FIG. 5 or FIG. 6.

While preferred embodiments of the invention have been shown and described, it will be understood by persons skilled in the art that various changes and modifications may be made without departing from the spirit and scope of the invention which is defined by the following claims. For example, it is understood that a variety of circuitry could accomplish the implementation of the method of the invention, or that a head-related impulse response could be implemented via other mathematical algorithms without departing from the spirit and scope of the invention.

What is claimed is:

1. A method of reducing the amount of computations required to create a sound signal representing one or more sounds originating at a plurality of discrete positions in space, where the signal is to be perceived as simulating one or more sounds at one or more selected positions in space with respect to a listener, comprising the steps of:

determining a spatial characteristic function for a position in space at which sound originating at a plurality of positions in space is to be received, wherein said characteristic function represents a head-related impulse response;

applying said characteristic function as a filter to said signal representing sound to produce a filtered signal; and converting said filtered signal to a sound wave and producing said sound wave for a listener;

wherein said spatial characteristic function is determined for a selected number of N samples and a selected number of M eigen values and wherein said filter with a function for an azimuth position θ and an elevation position $\varphi$ of sound originating in a spherical coordinate system about said position of sound measurement as said origin has a form $$y(n) = \sum_{m=1}^{M}\left[\sum_{k=1}^{K} w_m(\theta_k, \varphi_k)s_k(n)\right]q_m(n) \qquad 9(c)$$

where s represents a sound source, K represents a number of independent sound sources, $w_m(\theta,\varphi)$ are weighting factors, and $q_m(n)$ is a vector representing an orthonormal basis for a head-related impluse function.

2. The method of claim 1, wherein said characteristic function further comprises information concerning an environment in which sound is to be perceived.

3. The method of claim 1, wherein said characteristic function is a spatial feature extraction and regularization model.

4. The method of claim 3 wherein said spatial feature extraction and regularization model comprises a spatial component and a temporal component.

5. The method of claim 4 wherein said temporal component comprises a summed matrix of a predetermined number of eigen vectors.

6. The method of claim 5 wherein said predetermined number of eigen vectors is of a range from 3 to 16.

7. The method of claim 5 wherein said spatial and temporal components are determined via a Karhunen-Loeve Expansion.

8. Apparatus for providing sound created by a sound source to a listener which simulates the sound source at a selected position in space with respect to the listener, comprising:

an input for receiving a signal representing sound originating at a plurality of positions in space, said input being adapted to receive a plurality of positions, said plurality of positions comprising any one of multiple sources without reflections, and multiple sources each with reflections;

a left channel and a right channel, wherein each channel comprises a filter array for applying a filter to said signal received by said input to provide a filtered signal, said filter comprising a linear function including a spatial component which comprises a head-related impulse response; and an output for converting said filtered signals from said channels to a binaural sound and for producing said sound for a listener;

wherein said linear function comprises a spatial feature extraction and regularization model.

9. The apparatus of claim 8 wherein said linear function includes a spatial component, said spatial component comprising signal delay and attenuation for simulating reflected sound created by surfaces of a sound reproduction environment.

10. Apparatus for providing sound created by a sound source to a listener which simulates the sound source at a selected position in space with respect to the listener, comprising:

an input for receiving a signal representing sound originating at a plurality of positions in space, said input being adapted to receive a plurality of positions, said plurality of positions comprising any one of multiple sources without reflections, and multiple sources each with reflections;

a left channel and a right channel, wherein each channel comprises a filter array for applying a filter to said signal received by said input to provide a filtered signal, said filter comprising a linear function including a spatial component which comprises a head-related impulse response; and an output for converting said filtered signals from said channels to a binaural sound and for producing said sound for a listener;

wherein said linear function includes a temporal component, said temporal component comprising a summed array of a predetermined number of eigen filters.

11. Apparatus for providing sound created by a sound source to a listener which simulates the sound source at a selected position in space with respect to the listener, comprising:

an input for receiving a signal representing sound originating at a plurality of positions in space, said input being adapted to receive a plurality of positions, said plurality of positions comprising any one of including multiple sources without reflections, and multiple sources each with reflections;

a left channel and a right channel, wherein each channel comprises a filter array for applying a filter to said signal received by said input to provide a filtered signal, said filter comprising a linear function including a spatial component which comprises a head-related impulse response;

an output for converting said filtered signals from said channels to a binaural sound and for producing said sound for a listener;

an environment input for receiving information concerning a listening environment to be simulated and relative position of a listener; and a calculator for receiving said information from said environment input, and calculating attenuation and time delays to simulate said environment and said listener position;

wherein said output of said calculator is input into said filter array as factors for said linear function.

12. The apparatus of claim 11 further comprising a summed array of a predetermined number of eigen filters attached to said signal input and receiving the signal therefrom, wherein said eigen filters introduce time delays into said signal.

13. Apparatus for providing sound created by a sound source to a listener which simulates the sound source at a selected position in space with respect to the listener, comprising:

an input for receiving a signal representing sound originating at a plurality of positions in space, said input being adapted to receive a plurality of positions, said plurality of positions comprising any one of multiple sources without reflections, and multiple sources each with reflections;

a left channel and a right channel, wherein each channel comprises a filter array for applying a filter to said signal received by said input to provide a filtered signal, said filter comprising a linear function including a spatial component which comprises a head-related impulse response;

an output for converting said filtered signals from said channels to a binaural sound and for producing said sound for a listener;

an environment input for receiving information concerning a listening environment to be simulated and relative position of a listener;

a calculator for receiving said information from said environment input, and calculating attenuation and time delays to simulate said environment and said listener position, with an output of said calculator is input into said filter array as factors for said linear function;

a summed array of a predetermined number of eigen filters attached to said signal input and receiving said signal therefrom, wherein said eigen filters introduce time delays into said signal;

a plurality of source placement arrays, wherein each source placement array receives said output of a single eigen filter and filters said signal in accordance with a spatial characteristic function and said output of said calculator;

a summer for summing said output of said source placement arrays; and a timer and delay for receiving said summed output signal from said summer and a delay count from said calculator.

* * * * *